US010327068B2

(12) United States Patent
Voishvillo

(10) Patent No.: US 10,327,068 B2
(45) Date of Patent: Jun. 18, 2019

(54) COMPRESSION DRIVER WITH SIDE-FIRING COMPRESSION CHAMBER

(71) Applicant: Harman International Industries, Incorporated, Stamford, CT (US)

(72) Inventor: Alexander Voishvillo, Simi Valley, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 15/814,770

(22) Filed: Nov. 16, 2017

(65) Prior Publication Data

US 2019/0149911 A1 May 16, 2019

(51) Int. Cl.

*H03G 7/00* (2006.01)
*H04R 1/20* (2006.01)
*H04R 1/34* (2006.01)
*H04R 13/00* (2006.01)
*H04R 1/30* (2006.01)

(52) U.S. Cl.

CPC ............... *H04R 1/345* (2013.01); *H04R 1/30* (2013.01); *H04R 13/00* (2013.01); *H04R 2400/13* (2013.01)

(58) Field of Classification Search

CPC .......... H04R 1/30; H04R 1/345; H04R 13/00; H04R 2400/13; H04R 7/00; H04R 7/12; H04R 7/14; H04R 11/00; H04R 11/02

USPC ......................... 381/202, 340, 342, 343, 423

See application file for complete search history.

(56) References Cited

U.S. PATENT DOCUMENTS 4,325,456 A 4/1982 Ureda
4,975,965 A * 12/1990 Adamson .................. B32B 5/12 181/159
5,537,481 A 7/1996 Voishvillo et al.
5,875,252 A * 2/1999 Lesage ...................... H04R 7/18 381/340
5,878,148 A * 3/1999 Alexandrov ............. G10K 9/13 381/337

(Continued)

FOREIGN PATENT DOCUMENTS

DE 102015209837 A1 12/2015
EP 1592281 A2 11/2005
EP 2640089 A2 9/2013

OTHER PUBLICATIONS

Alex Voishvillo, Audio Engineering Society, Convention Paper 9618, Sep. 29-Oct. 2, 2016, Los Angeles, USA, 16 pages.

(Continued)

*Primary Examiner* — Khai N. Nguyen

(74) *Attorney, Agent, or Firm* — Brooks Kushman P.C.

(57) ABSTRACT

A compression driver includes a magnet assembly and a waveguide mounted to the magnet assembly, the waveguide having a first side, an opposed second side, and a central aperture forming an exit of the compression driver. An annular diaphragm is disposed above the magnet assembly and adjacent the second side of the waveguide, the diaphragm having an external flat portion generally coplanar with an internal flat portion. A compression chamber is defined between the diaphragm and the second side of the waveguide, the second side of the waveguide having a final segment that tapers toward the central aperture, wherein part of the diaphragm is loaded by the compression chamber and part of the diaphragm radiates directly to the exit of the compression driver.

20 Claims, 10 Drawing Sheets

(56) References Cited

U.S. PATENT DOCUMENTS

| | | | | |
|---|---|---|---|---|
| 6,320,970 | B1 | 11/2001 | Czerwinski et al. | |
| 6,744,899 | B1 * | 6/2004 | Grunberg | H04R 1/30 381/340 |
| 7,039,211 | B2 | 5/2006 | Werner | |
| 8,036,408 | B2 | 10/2011 | Voishvillo | |
| 8,077,897 | B2 | 12/2011 | Voishvillo | |
| 8,280,091 | B2 | 10/2012 | Voishvillo | |
| 2003/0215107 | A1 * | 11/2003 | Werner | H04R 1/30 381/343 |
| 2004/0156519 | A1 | 8/2004 | Geddes | |
| 2007/0147647 | A1 * | 6/2007 | Voishvillo | H04R 1/30 381/343 |
| 2008/0013781 | A1 * | 1/2008 | Sagren | H04R 9/043 381/398 |
| 2009/0154751 | A1 * | 6/2009 | Robineau | B06B 3/00 381/340 |
| 2009/0310809 | A1 * | 12/2009 | Voishvillo | H04R 1/30 381/343 |
| 2011/0085692 | A1 * | 4/2011 | Voishvillo | H04R 1/30 381/343 |
| 2011/0168480 | A1 | 7/2011 | Sterling et al. | |
| 2012/0027238 | A1 | 2/2012 | Voishillo | |
| 2013/0070954 | A1 * | 3/2013 | Flavignard | H04R 7/16 381/400 |
| 2015/0373445 | A1 * | 12/2015 | Voishvillo | H04R 1/30 381/150 |
| 2016/0105744 | A1 * | 4/2016 | Voishvillo | H04R 1/30 381/343 |
| 2018/0054671 | A1 * | 2/2018 | Voishvillo | H04R 9/066 |

OTHER PUBLICATIONS

International Search Report and Written Opinion for Application No. PCT/US2017/042715, dated Sep. 11, 2017, 13 pages.

* cited by examiner

COMPRESSION DRIVER WITH SIDE-FIRING COMPRESSION CHAMBER

TECHNICAL FIELD

Embodiments relate to a compression driver with a side-firing compression chamber, such as for use in a horn driver.

BACKGROUND

There are two major types of compression drivers, the first utilizing a dome diaphragm, and the other using an annular flexural diaphragm. The majority of modern annular diaphragms are made of polymer films. The advantage of annular diaphragms is the smaller radial dimensions of the moving part of the diaphragm compared to the dome diaphragms having the same diameter of the moving voice coil. The small radial clamping dimension of the annular diaphragm shifts the mechanical breakup resonances of the diaphragm to higher frequencies where they can be better mechanically damped, since the damping is more efficient at high frequencies in polymer films. Better damping is indicative of the smoother frequency response and lower nonlinear distortion generated by diaphragms' breakups at high frequency.

In a compression driver, the diaphragm is loaded by a compression chamber, which is a thin layer of air separating the diaphragm from a phasing plug. The phasing plug receives an acoustical signal produced by the vibrating diaphragm and directs it to the exit of the compression driver. One of the primary features of a conventional compression driver is the difference between the larger effective area of the diaphragm and the smaller area of the compression chamber exit. The smaller area of the compression chamber exit increases its input impedance that loads the diaphragm. In theory, a compression driver reaches maximum efficiency when the mechanical output impedance of the vibrating diaphragm equals the loading impedance of the acoustical load. This assumption is approximate because, in reality, both impedances are different, complex, frequency-dependent functions.

A typical compression chamber has a single or multiple narrow exits expanding to the exit of the compression driver. Two types of linear distortion may occur in the compression chamber. One type is the attenuation of the high frequency sound pressure signal caused by the compliance of air trapped in the compression chamber. The volume of entrapped air is characterized by an acoustical compliance which is proportional to the volume of compression chamber. Acoustical compliance acts as a low-pass filter of the first order and it mitigates the high frequency signal. The second type of distortion is the irregularity of the high frequency sound pressure level (SPL) frequency response caused by air resonances in the compression chamber. The latter typically interact with high frequency mechanical resonances of the vibrating diaphragm.

SUMMARY

In one embodiment, a compression driver includes a magnet assembly and a waveguide mounted to the magnet assembly, the waveguide having a first side, an opposed second side, and a central aperture forming an exit of the compression driver. An annular diaphragm is disposed above the magnet assembly and adjacent the second side of the waveguide, the diaphragm having an external flat portion generally coplanar with an internal flat portion. A compression chamber is defined between the diaphragm and the second side of the waveguide, the second side of the waveguide having a final segment that tapers toward the central aperture, wherein part of the diaphragm is loaded by the compression chamber and part of the diaphragm radiates directly to the exit of the compression driver.

In another embodiment, a compression driver includes a magnet assembly including a back plate having a centrally disposed pole piece, and a hub portion mounted to the pole piece. A waveguide is mounted to the magnet assembly, the waveguide having a first side and an opposed second side, the waveguide having a central aperture generally aligned with the hub portion and forming an exit of the compression driver. An annular diaphragm is disposed above the magnet assembly and adjacent the second side of the waveguide, the diaphragm having a V-shaped section between an external flat portion and an internal flat portion. A compression chamber is defined between the diaphragm and the second side of the waveguide, the second side of the waveguide having an initial segment which is generally parallel to the external flat portion of the diaphragm and a final segment that tapers toward the central aperture, such that part of the diaphragm is loaded by the compression chamber and part of the diaphragm radiates directly to the exit of the compression driver.

In another embodiment, a compression driver includes a magnet assembly including a back plate having a centrally disposed pole piece, and a hub portion mounted to the pole piece. A waveguide is mounted to the magnet assembly, the waveguide having a first side and an opposed second side, the waveguide having a central aperture generally aligned with the hub portion and forming an exit of the compression driver. An annular diaphragm is disposed above the magnet assembly and adjacent the second side of the waveguide, the diaphragm having a V-shaped section between an external flat portion and an internal flat portion, the hub portion extending generally parallel to and over at least a portion of the internal flat portion of the diaphragm. A compression chamber is defined between the diaphragm and the hub portion and between the diaphragm and the second side of the waveguide, the second side of the waveguide having a final segment that tapers toward the central aperture, such that part of the diaphragm is loaded by the compression chamber and part of the diaphragm radiates directly to the exit of the compression driver.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Embodiments of the compression driver disclosed herein include a side-firing compression chamber, where the compression chamber exit may be positioned by the internal diameter of the chamber. Therefore, part of the diaphragm is loaded by the "side-firing" compression chamber and part of the diaphragm radiates directly to the exit of the driver. The overall signal is a superposition of the compression chamber part and the direct-radiating part. This significantly simplifies the configuration of the compression driver and radial resonances are not excited in the audio frequency range. In addition, the simplicity in configuration provides lower production cost.

The acoustical behavior of a "side-firing" compression chamber open on its internal diameter is different from that of an annular compression chamber with hard walls on its internal and external diameters. Specifically, the side-firing compression chamber does not have a hard wall on its internal diameter, and it is loaded by the corresponding acoustical impedance of the waveguide and horn connected to it. Embodiments disclosed herein do not exhibit resonance behavior due to the different acoustical nature of the chamber and different boundary conditions. The compression driver maximizes the high-frequency SPL output as well as smoothness and simple equalizability of the SPL frequency response.

Figure 1A:
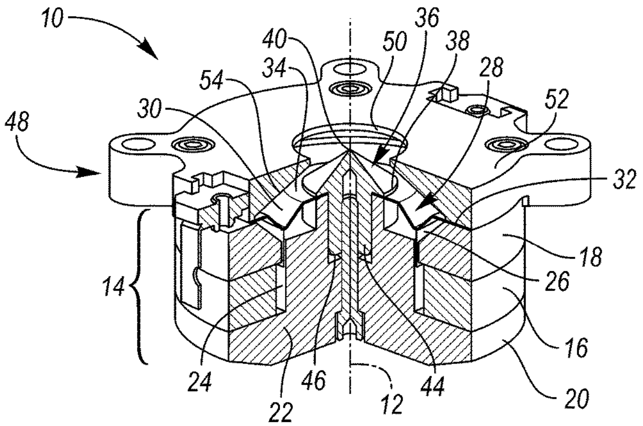
FIG. 1A is a perspective view, partially cut away, of a compression driver having an open diaphragm configuration of the compression chamber according to an embodiment.
Figure 1B:
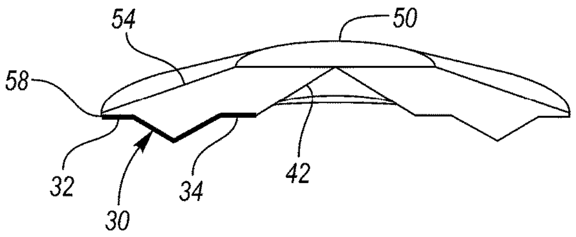
FIG. 1B illustrates an air model of the configuration of FIG. 1A.

With reference first to FIGS. 1A and 1B, an embodiment of a compression driver 10 is illustrated, where the compression driver 10 can be used in a horn driver with an attached horn (not shown). The compression driver 10 is generally disposed about a central axis 12. The compression driver 10 may include a magnet assembly 14 which may comprise an annular permanent magnet 16 disposed between an annular top plate 18 and a back plate 20 that includes a centrally disposed cylindrical or annular pole piece 22. The magnet assembly 14 provides a permanent magnetic field in the gap 24 between the pole piece 22 and an inside surface of the annular top plate 18 for electrodynamic coupling with a voice coil 26. The voice coil 26 is disposed in the magnetic gap 24 and produces the movement of the flexible portion of a diaphragm 28.

In the embodiments depicted herein, the diaphragm 28 is configured as an annular ring that is disposed coaxially with the central axis 12 above the magnet assembly 14. The diaphragm 28 may include a profiled section 30 such as a V-shaped section between an external generally flat portion 32 and an internal generally flat portion 34, wherein the external flat portion 32 and the internal flat portion 34 may be generally coplanar. In other implementations, the diaphragm 28 may have other suitable configurations.

With continuing reference to FIGS. 1A and 1B, the compression driver 10 also includes a hub portion 36 which is coaxially disposed about the central axis 12. The hub portion 36 may also be referred to as a bullet. The hub portion 36 has a first end 38 disposed proximate to the pole piece 22 and a second end 40 disposed at a distance from the pole piece 22 along the central axis 12. An outer surface 42 of the hub portion 36 may taper in the direction along the central axis 12 from the first end 38 to the second end 40, such that the radius of the cross-section of the hub portion 36 relative to the central axis 12 decreases in this direction.

The hub portion 36 may include a downwardly depending mounting member 44 which may have any configuration suitable for coupling the hub portion 36 to the rear section of the compression driver 10. In one embodiment, the mounting member 44 is provided in the form of a cylinder that is arranged to be press fit into a central bore 46 formed in the pole piece 22.

In the compression driver 10 disclosed herein, the typical front adapter and phasing plug are reduced to a single-piece, shallow waveguide 48 that provides compression, but only to a part of the diaphragm 28. The waveguide 48 is attached to the top plate 18, wherein a central aperture 50 of the waveguide 48 serves as a small diameter exit of the compression driver 10. The aperture 50 may be circular as shown, or alternatively may have another shape, such as elliptical or rectangular. As assembled, the central aperture 50 of the waveguide 48 is generally aligned with the hub portion 36. In one embodiment, the central aperture 50 is configured to substantially match the size and shape configuration of the horn inlet (not shown).

The small exit diameter of the compression driver 10 provides excellent control of the directivity at high frequencies up to 20 kHz. In one embodiment, the diameter of the central aperture 50 of the waveguide 48 is about 0.6 in., which may be smaller than the diameter of the diaphragm 28 (1.4 in.) and even smaller than the diameter of the voice coil 26 (1.0 in.). In the embodiments depicted, the height of the hub portion 36 does not extend above a height of the waveguide 48.

The waveguide 48 includes a generally planar first side 52, facing the horn (not shown), and an opposing second side 54 generally facing the diaphragm 28. A compression chamber 56 is defined in a space between the diaphragm 28 and the second side 54 of the waveguide 48 (see FIGS. 2-10). The actuation of the diaphragm 28 generates high sound-pressure acoustical signals within the compression chamber 56, and the signals travel towards the center of the compression driver 10, immediately adjacent to the central aperture 50 of the waveguide 48. From the aperture 50, the sound waves enter and radiate through the attached horn (not shown) and propagate into the ambient environment.

FIGS. 1-10 show different configurations of the compression driver 10 beginning from an open diaphragm 28 that radiates towards the central aperture 50 or exit of the compression driver 10 without a compression chamber (FIG. 1), to the classical design having a single narrow annular slot positioned at the radius of the first mode's null (FIG. 10). All ten figures show a cut away view of the compression driver 10, an "air" model (i.e. the acoustical part from the diaphragm 28 to the driver exit 50), and the relative SPL frequency response obtained by acoustical numerical modeling. The BEA-based numerical acoustic simulation shown included a horn model, where the horn is characterized by an extremely smooth acoustical input impedance and transfer function on and off axis, and where the length of the horn is 178 mm and the mouth diameter is 280 mm. The modeling was carried out for a constant acceleration of a diaphragm considered to be an infinitely hard annular shell (no breakup modes), having the shape of the real diaphragm and oscillating pistonically. The real annular flexural diaphragm is clamped by its internal and external radii and, strictly speaking, it does not move pistonically even at low frequencies.

Figure 1C:
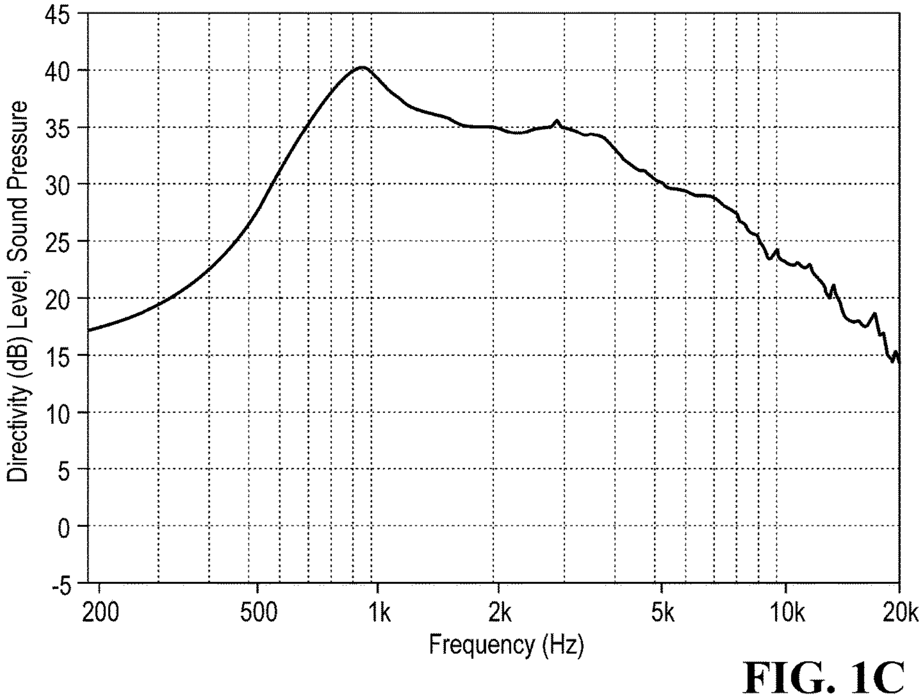
FIG. 1C is a graph of the far-field relative SPL frequency response of the compression driver configuration of FIG. 1A.

FIG. 1A depicts an embodiment of a compression driver 10 with an open diaphragm 28 radiating directly towards the exit 50 of the driver 10. In this configuration, the second side 54 of the waveguide 48 does not follow a contour of the external flat portion 32 of the diaphragm 28, and instead the second side 54 tapers from an outer edge 58 of the external flat portion 32 toward the driver exit 50. For example, an angle of the second side 54 may be similar to an angle of the outer surface 42 of the hub portion 36. FIG. 1B illustrates an air model of this configuration, where the bold line is the profile of the diaphragm 28. FIG. 1C is a graph of the far-field relative SPL frequency response of the compression driver 10 of FIG. 1A. As shown in FIG. 1C, the SPL response rolls down gradually from 1 kHz to 20 kHz. The overall decrease of the response between 3 kHz (end of the flat part of the response) to 20 kHz is 20 dB SPL. The response is smooth in general but it has comparatively low high-frequency output from 10 kHz to 20 kHz.

Figure 2A:
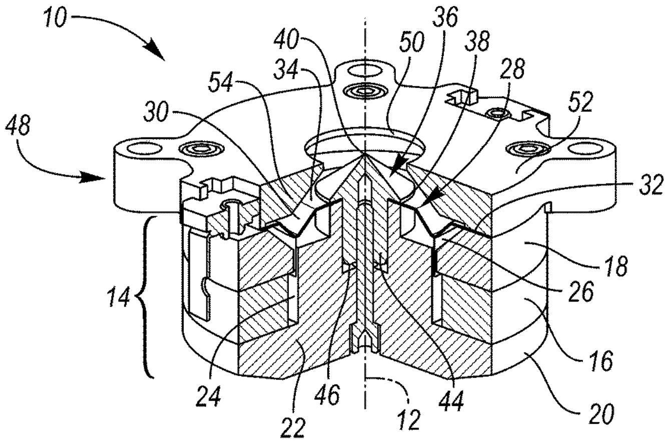
FIG. 2A is a perspective view, partially cut away, of a compression driver having a small side-firing compression chamber above the external flat surface of the diaphragm according to an embodiment.
Figure 2B:
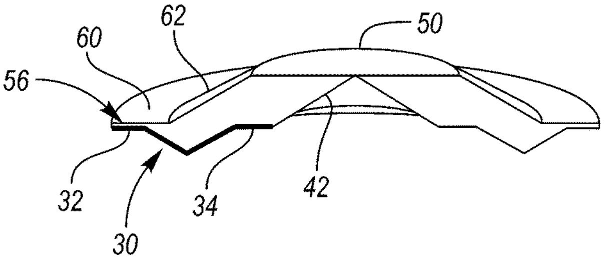
FIG. 2B illustrates an air model of the configuration of FIG. 2A.
Figure 2C:
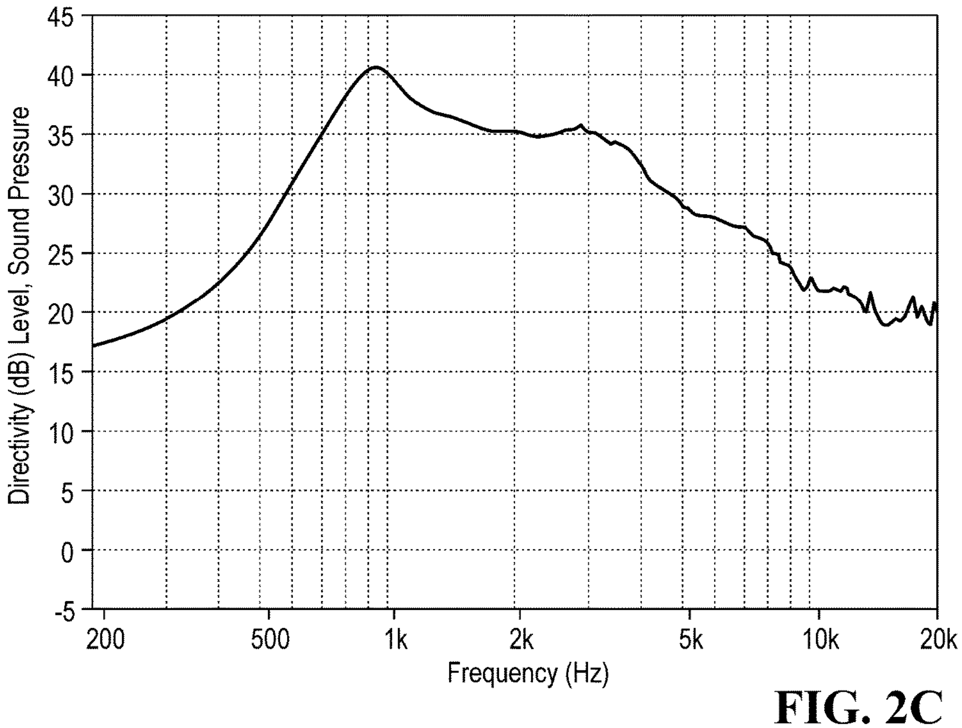
FIG. 2C is a graph of the relative SPL frequency response of the compression driver configuration of FIG. 2A.

FIG. 2A shows an embodiment of the compression driver 10 with a small side-firing compression chamber 56 positioned above the external flat portion 32 of the diaphragm 28. In this embodiment, the second side 54 of the waveguide 48 has an initial segment 60 which is generally parallel to the external flat portion 32 of the diaphragm 28, and may extend over at least a portion of the V-shaped section 30 of the diaphragm. The second side 54 of the waveguide 48 further includes a final segment 62 that tapers toward the driver exit 50. For example, an angle of the second side 54 may be similar to an angle of the outer surface 42 of the hub portion 36. FIG. 2B illustrates an air model of this configuration, and FIG. 2C is a graph of the relative SPL frequency response of the compression driver 10 of FIG. 2A. As shown in FIG. 2C, the SPL frequency response also gradually and smoothly rolls down from 3 kHz to 20 kHz, but its SPL output is 5 dB higher compared to the embodiment of FIG. 1A. The overall output is a superposition of the SPL generated by the side-firing compression chamber 56 and the part of the diaphragm 28 radiating without compression.

Figure 3A:
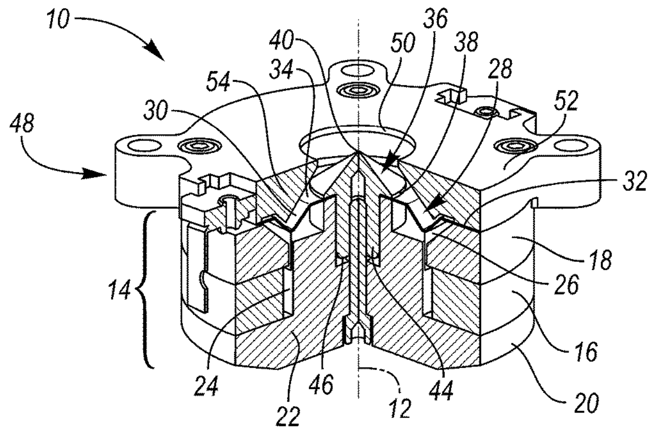
FIG. 3A is a perspective view, partially cut away, of a compression driver having an increased compression chamber with a side-firing configuration that starts "wrapping" of the profile of the diaphragm according to an embodiment.
Figure 3B:
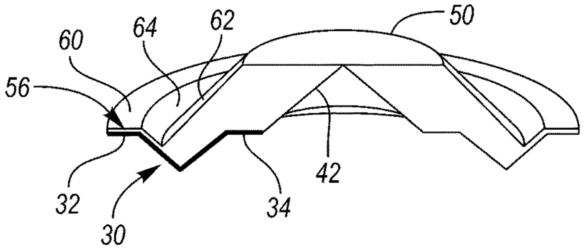
FIG. 3B illustrates an air model of the configuration of FIG. 3B.
Figure 3C:
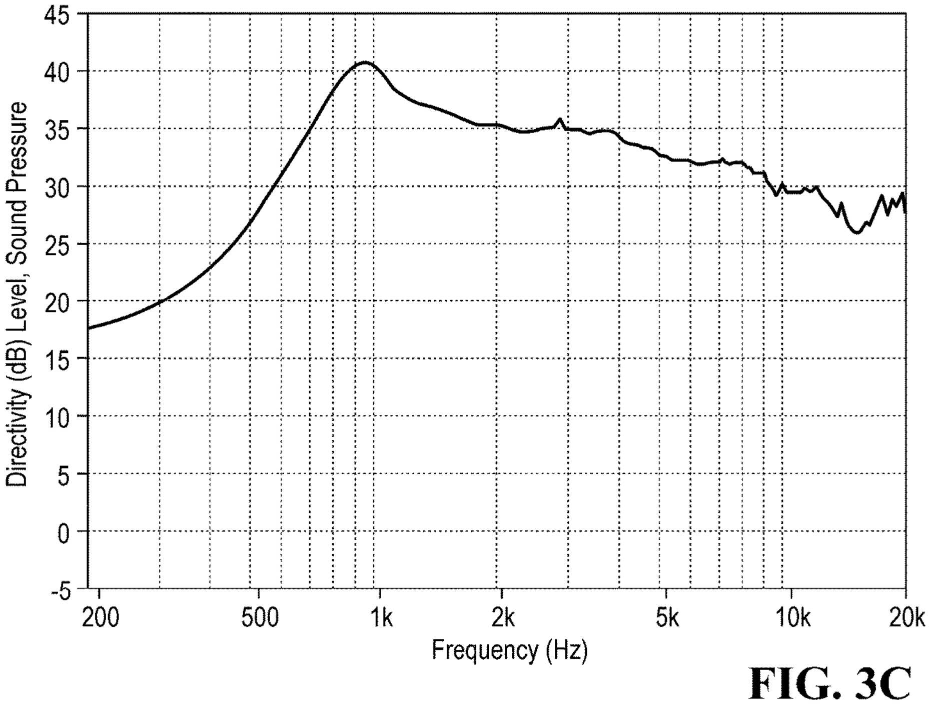
FIG. 3C is a graph of the relative SPL frequency response of the compression driver configuration of FIG. 3A.

FIG. 3A is a perspective view, partially cut away, of an embodiment of the compression driver 10 with an increased compression chamber 56 that follows a contour of at least a portion of the V-shaped section 30 of the diaphragm 28. In this embodiment, the second side 54 of the waveguide 48 has an initial segment 60 which is generally parallel to the external flat portion 32 of the diaphragm 28, an intermediate segment 64 that generally follows the contour of at least a portion of the V-shaped section 30 of the diaphragm 28, and a final segment 62 that tapers toward the driver exit 50, for example, at an angle which may be similar to an angle of the outer surface 42 of the hub portion 36. FIG. 3B illustrates an air model of this configuration, and FIG. 3C is a graph of the relative SPL frequency response of the compression driver 10 of FIG. 3A.

Figure 4A:
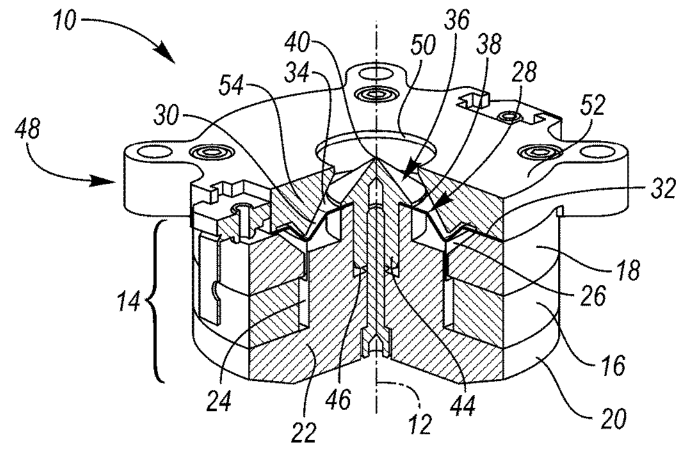
FIG. 4A is a perspective view, partially cut away, of a compression driver with a further increased compression chamber according to an embodiment.
Figure 4B:
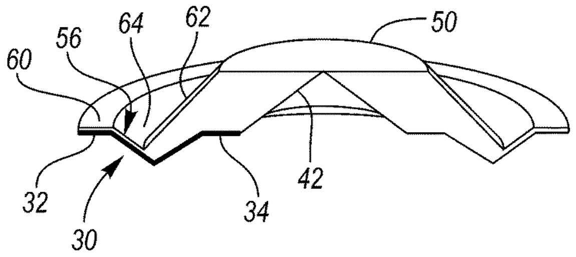
FIG. 4B illustrates an air model of the configuration of FIG. 4A.
Figure 4C:
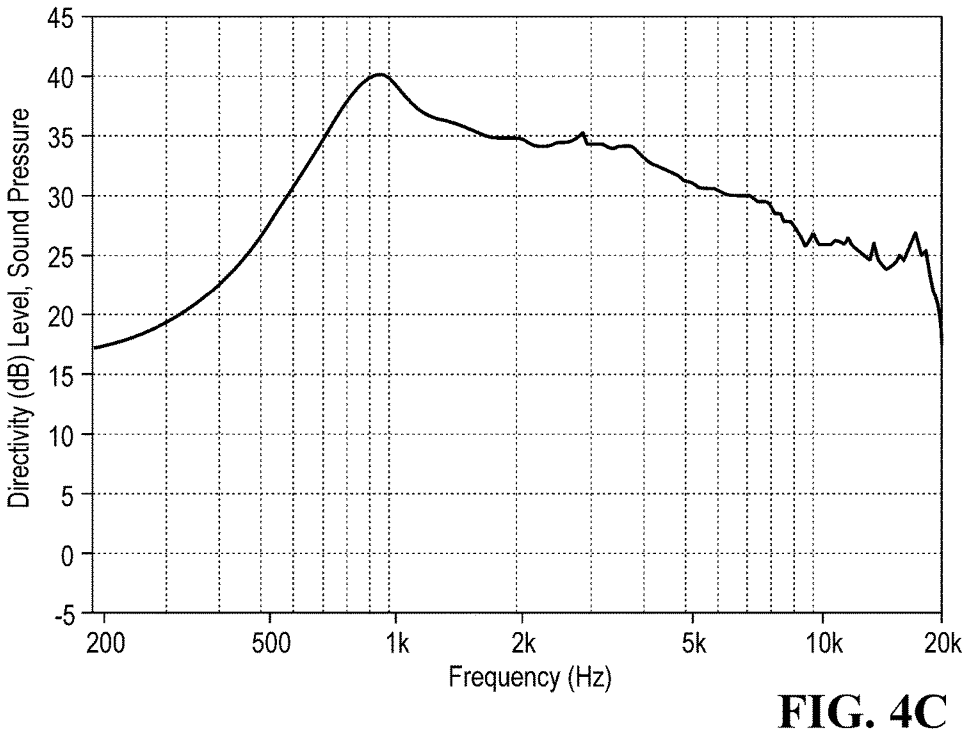
FIG. 4C is a graph of the relative SPL frequency response of the compression driver configuration of FIG. 4A.

FIG. 4A is a perspective view, partially cut away, of an embodiment of the compression driver 10 with a compression chamber 56 which follows a contour of a larger portion the V-shaped section 30 of the diaphragm 28 as compared to FIG. 3A. In this embodiment, the second side 54 of the waveguide 48 again has an initial segment 60 which is generally parallel to the external flat portion 32 of the diaphragm 28, an intermediate segment 64 that generally follows the contour of at least a portion of the V-shaped section 30 of the diaphragm 28, and a final segment 62 that tapers toward the driver exit 50, for example, at an angle which may be similar to an angle of the outer surface 42 of the hub portion 36. FIG. 4B illustrates an air model of this configuration, and FIG. 4C is a graph of the relative SPL frequency response of the compression driver 10 of FIG. 4A.

Figure 5A:
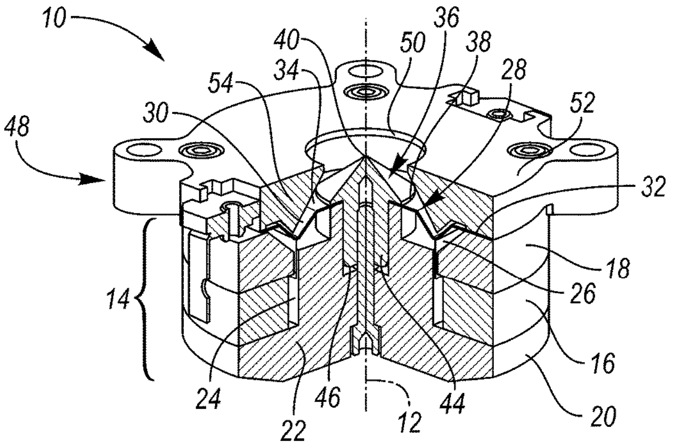
FIG. 5A is a perspective view, partially cut away, of a compression driver with a side-firing compression chamber that extends to the tip of the V-shape profile of the diaphragm according to an embodiment.
Figure 5B:
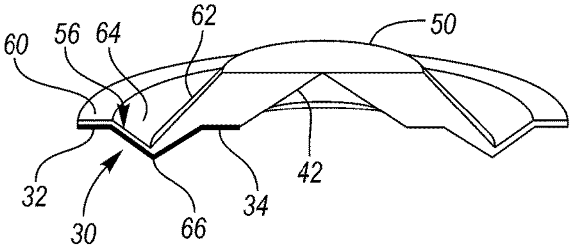
FIG. 5B illustrates an air model of the configuration of FIG. 5A.
Figure 5C:
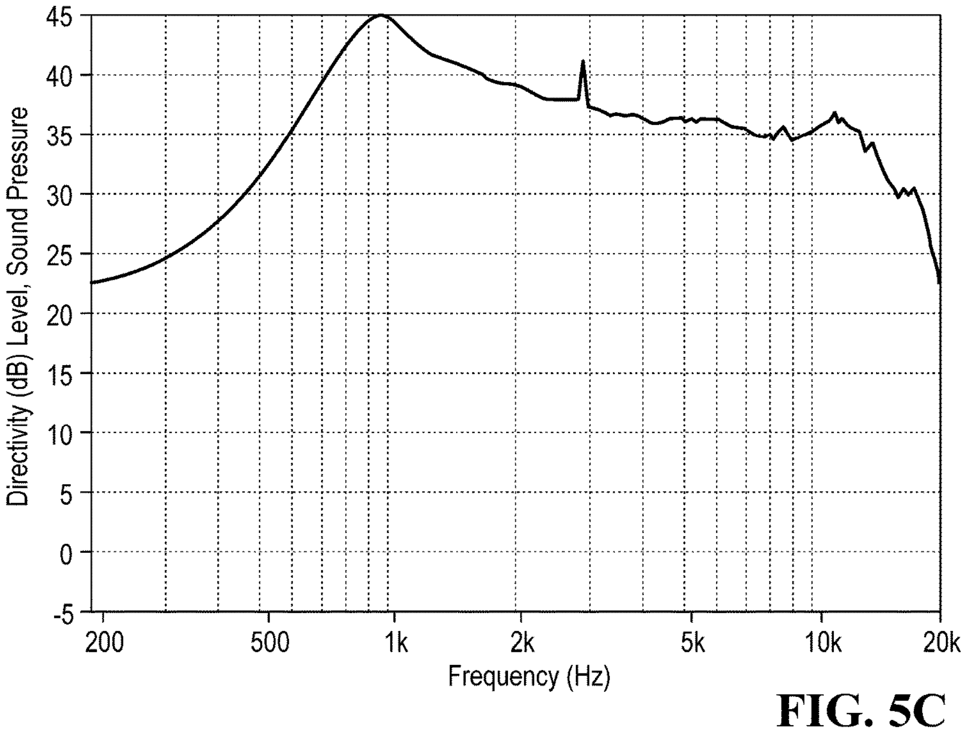
FIG. 5C is a graph of the relative SPL response of the compression driver configuration of FIG. 5A.

FIG. 5A depicts an embodiment of the compression driver 10 with a side-firing compression chamber 56 that extends to a tip 66 of the V-shaped section 30 of the diaphragm 28. In this embodiment, the second side 54 of the waveguide 48 has an initial segment 60 which is generally parallel to the external flat portion 32 of the diaphragm 28, an intermediate segment 64 that generally follows the contour of the V-shaped section 30 of the diaphragm 28 to its tip 66, and a final segment 62 that tapers toward the driver exit 50, for example, at an angle which may be similar to an angle of the outer surface 42 of the hub portion 36. FIG. 5B illustrates an air model of this configuration, and FIG. 5C is a graph of the relative SPL response of the compression driver 10 of FIG. 5A. As shown in FIG. 5C, the frequency response starts rolling off above 13 kHz.

Figure 6A:
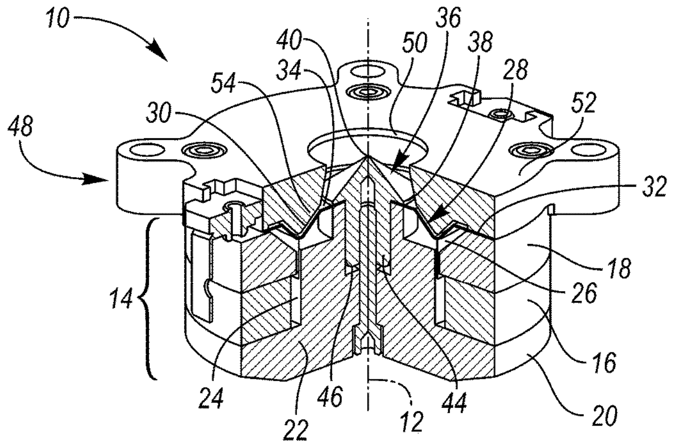
FIG. 6A is a perspective view, partially cut away, of a compression driver with a side-firing compression chamber that extends to the inner diameter edge of the V-shaped profile of the diaphragm according to an embodiment.
Figure 6B:
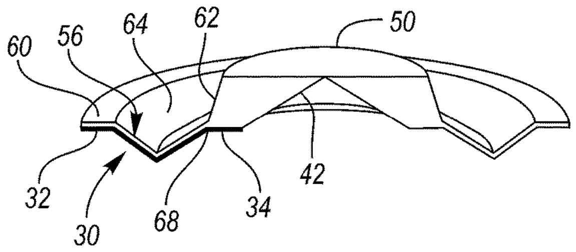
FIG. 6B illustrates an air model of the configuration of FIG. 6A.
Figure 6C:
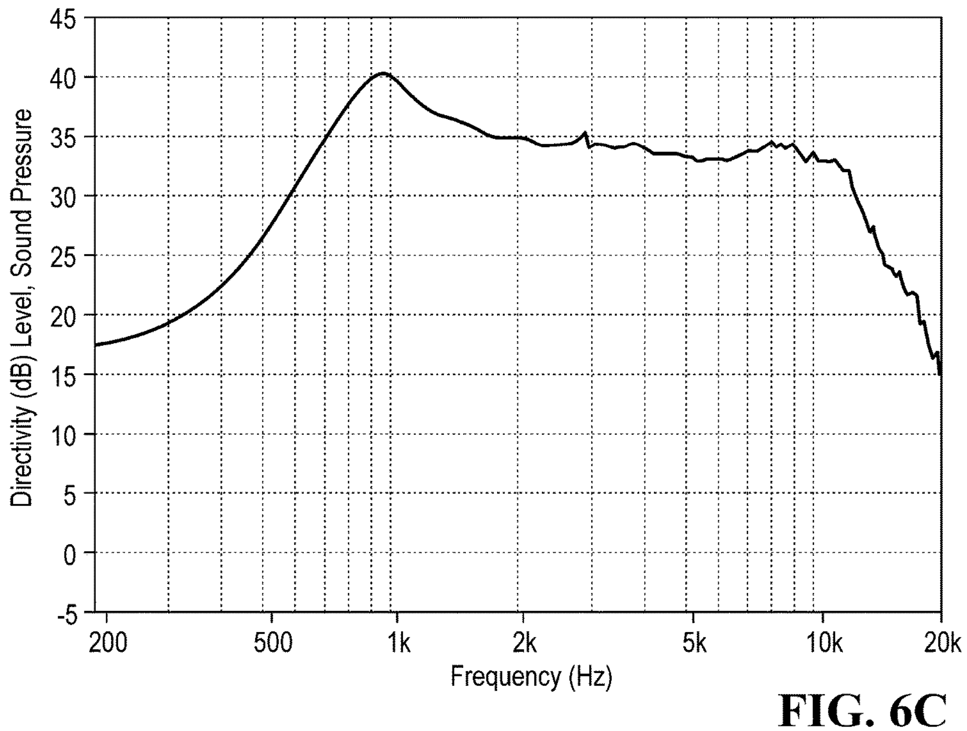
FIG. 6C is a graph of the relative SPL response of the compression driver configuration of FIG. 6A.

FIG. 6A is a perspective view, partially cut away, of an embodiment of the compression driver 10 with a side-firing compression chamber 56 that extends along substantially the entire V-shaped section 30 of the diaphragm 28, terminating at an inner edge 68 of the internal flat portion 34 of the diaphragm 28. In this embodiment, the second side 54 of the waveguide 48 has an initial segment 60 which is generally parallel to the external flat portion 32 of the diaphragm 28, an intermediate segment 64 that generally follows the contour of the V-shaped section 30 of the diaphragm 28 to the inner edge 68 of the internal flat portion 34 of the diaphragm 28, and a final segment 62 that tapers toward the driver exit 50. FIG. 6B illustrates an air model of this configuration, and FIG. 6C is a graph of the relative SPL response of the compression driver configuration of FIG. 6A. As shown in FIG. 6C, the high frequency roll-off continues increasing.

Figure 7A:
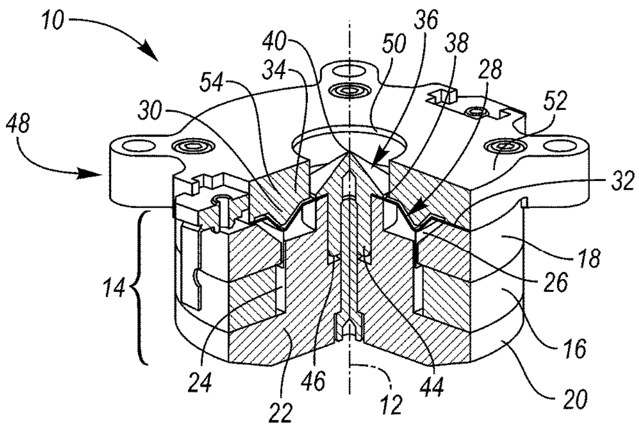
FIG. 7A is a perspective view, partially cut away, of a compression driver with a side-firing compression chamber that extends over the internal flat part of the diaphragm towards the center of the driver according to an embodiment.
Figure 7B:
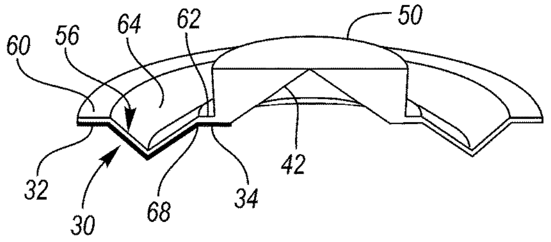
FIG. 7B illustrates an air model of the configuration of FIG. 7A.
Figure 7C:
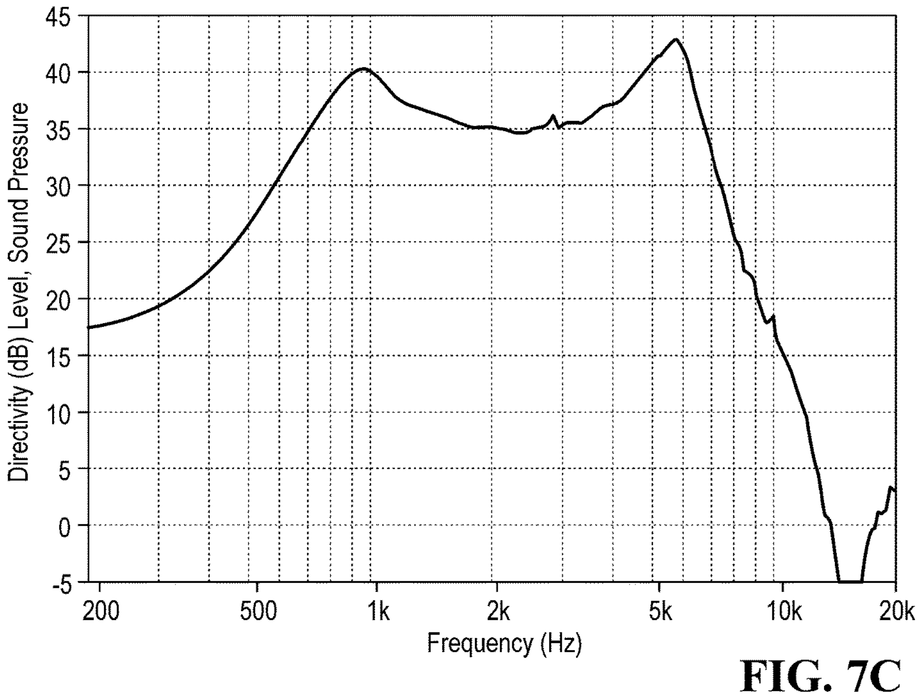
FIG. 7C is a graph of the relative SPL response of the compression driver configuration of FIG. 7A.

Further extension of the side-firing compression chamber 56 towards the center of the driver 10 results in the onset of the first radial mode in the compression chamber 56. FIG. 7A depicts an embodiment of a compression driver 10 with a side-firing compression chamber 56 which further extends towards the center of the driver 10, over the internal flat portion 34 of the diaphragm 28. In this embodiment, the second side 54 of the waveguide 48 has an initial segment 60 which is generally parallel to the external flat portion 32 of the diaphragm 28, an intermediate segment 64 that generally follows the contour of the V-shaped section 30 of the diaphragm 28, and a final segment 62 that is generally parallel to and extends over at least a portion of the internal flat portion 34 of the diaphragm. FIG. 7B illustrates an air model of this configuration, and FIG. 7C is a graph of the relative SPL response of the compression driver 10 of FIG. 7A. This configuration and its acoustical behavior are similar to a compression chamber that has hard-wall boundary conditions on both internal and external radii of the chamber and with an exit that is positioned incorrectly and does not block the first radial mode (A. Voishvillo, "Compression Drivers' Phasing Plugs—Theory and Practice", presented at the 141$^{th}$ AES Convention, 2016, Los Angeles, preprint 9618).

Figure 8A:
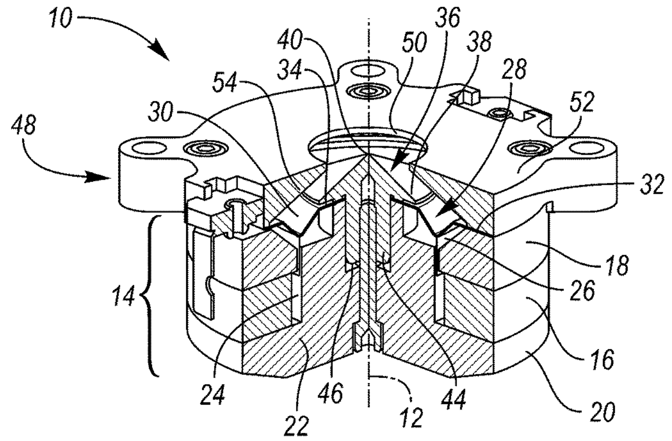
FIG. 8A is a perspective view, partially cut away, of a compression driver with a side-firing compression chamber located above the internal flat side of the diaphragm according to an embodiment.
Figure 8B:
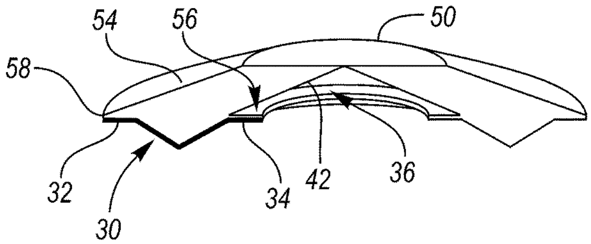
FIG. 8B illustrates an air model of the configuration of FIG. 8A.
Figure 8C:
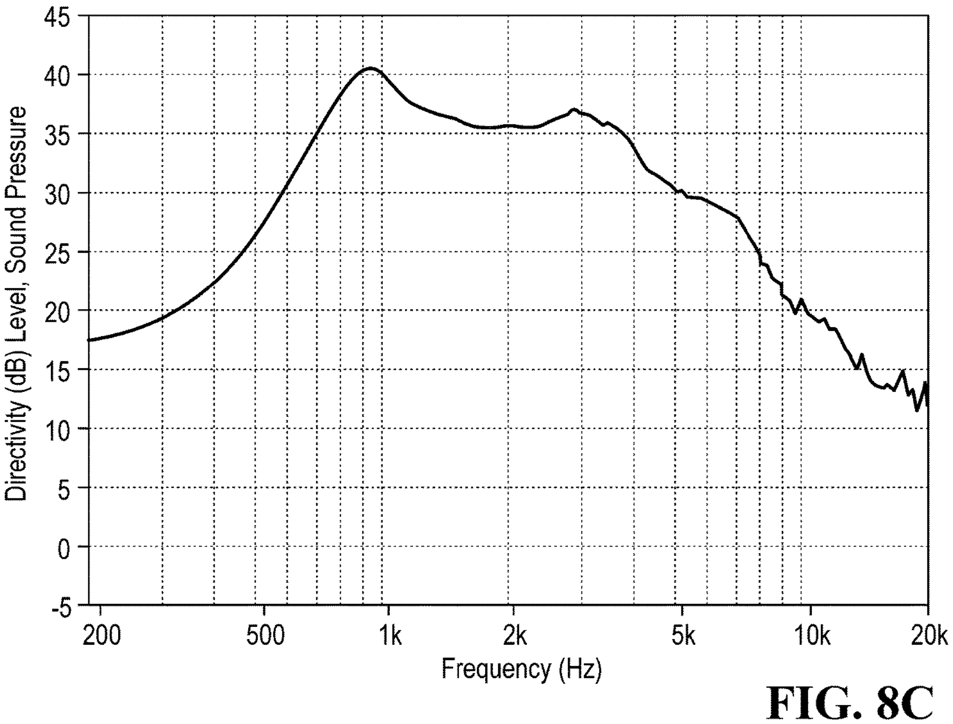
FIG. 8C is a graph of the relative SPL frequency response of the compression driver configuration of FIG. 8A.

FIG. 8A shows an embodiment of a compression driver 10 with a side-firing compression chamber 56 located above the internal flat portion 34 of the diaphragm 28 and with an open external part. In this embodiment, the compression chamber 56 may be created by the hub portion 36 extending generally parallel to and over at least a portion of the internal flat portion 34 of the diaphragm 28. The second side 54 of the waveguide 48 does not follow a contour of the external flat portion 32 of the V-shaped section 30 of the diaphragm 28, and instead tapers from the outer edge 58 of the external flat portion 32 toward the driver exit 50. FIG. 8B illustrates an air model of this configuration, and FIG. 8C is a graph of the relative SPL frequency response of the compression driver 10 of FIG. 8A. As shown in FIG. 8C, the SPL frequency response has a slight bump at 3 kHz and then drops by 22 dB at 20 kHz.

Figure 9A:
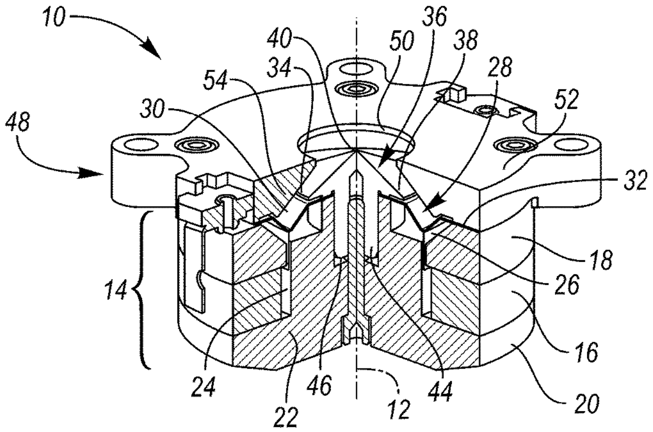
FIG. 9A is a perspective view, partially cut away, of a compression driver with side-firing compression chambers positioned over the external and internal flat segments of the diaphragm according to an embodiment.
Figure 9B:
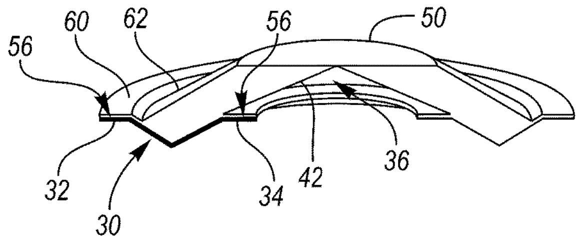
FIG. 9B illustrates an air model of the configuration of FIG. 9A.
Figure 9C:
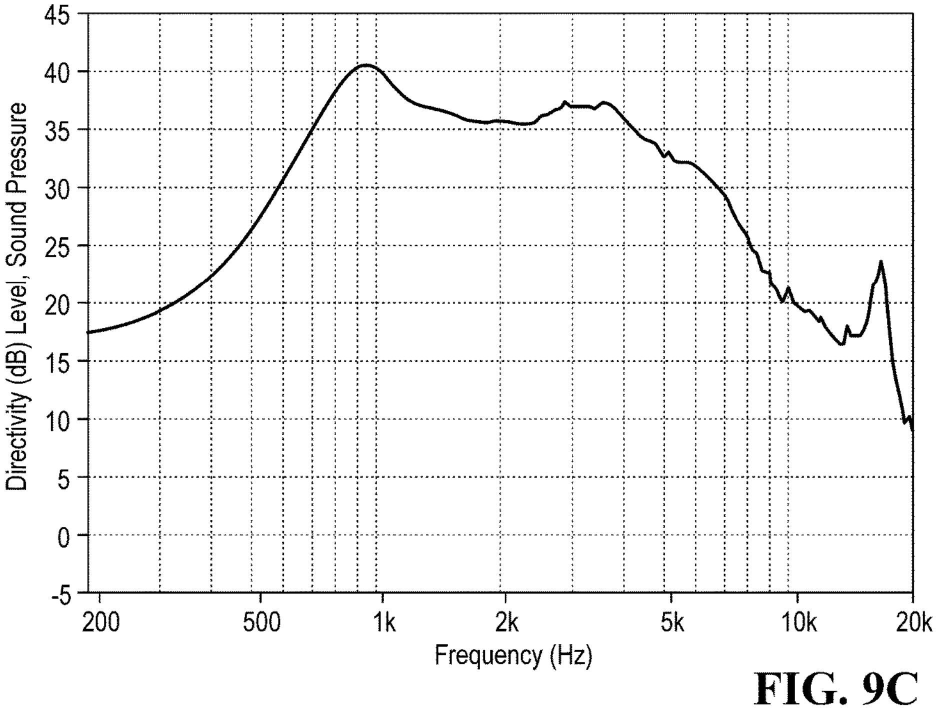
FIG. 9C is a graph of the relative SPL frequency response of the compression driver configuration of FIG. 9A.

FIG. 9A is a perspective view, partially cut away, of an embodiment of a compression driver 10 with side-firing compression chambers 56 positioned over the external and internal flat portions 32, 34 of the diaphragm 28. In this embodiment, one compression chamber 56 may be created by the hub portion 36 extending generally parallel to and over at least a portion of the internal flat portion 34 of the diaphragm 28. Another compression chamber 56 may be created by the second side 54 of the waveguide 48 having an initial segment 60 extending generally parallel to and over at least a portion of the external flat portion 32 of the diaphragm 28. The second side 54 of the waveguide 48 may further include an intermediate segment 64 that generally follows the contour of at least a portion of the V-shaped section 30 of the diaphragm 28, and a final segment 62 that tapers toward the driver exit 50, for example, at an angle which may be similar to an angle of the outer surface 42 of the hub portion 36. FIG. 9B illustrates an air model of this configuration, and FIG. 9C is a graph of the relative SPL frequency response of the compression driver 10 of FIG. 9A. As shown in FIG. 9C, the high-frequency SPL frequency response is higher than that of the previous three configurations, but it is not smooth and has a 7 dB spike at 16.7 kHz followed by a steep drop.

Figure 10A:
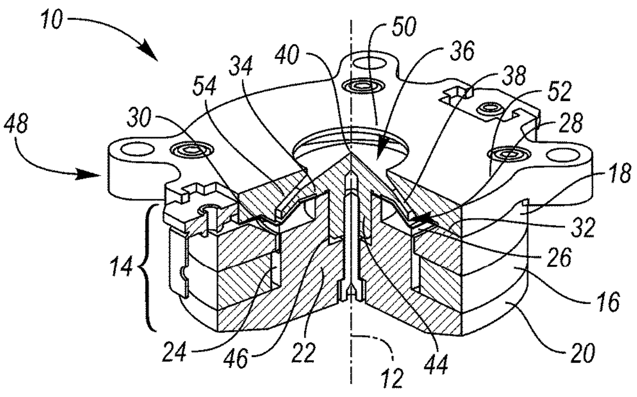
FIG. 10A is a perspective view, partially cut away, of a compression driver with an annular ring slot exit from the compression chamber according to an embodiment.
Figure 10B:
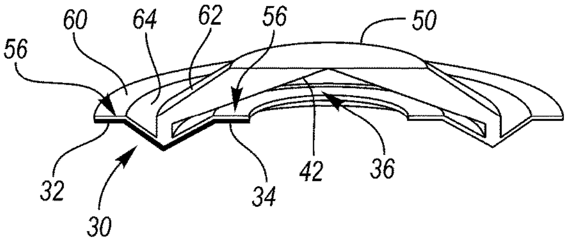
FIG. 10B illustrates an air model of the configuration of FIG. 10A.
Figure 10C:
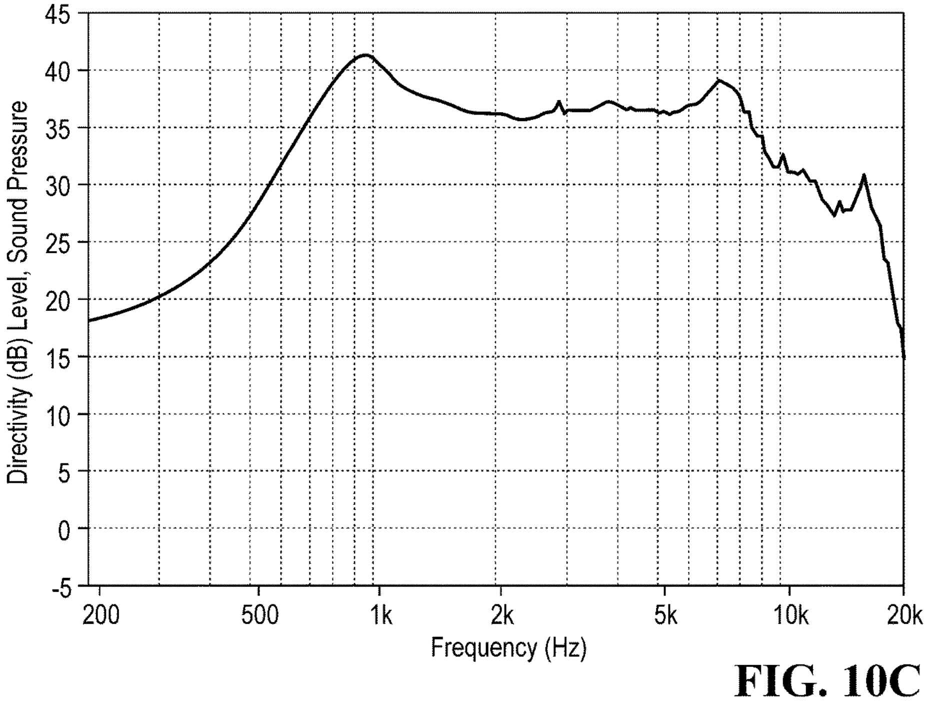
FIG. 10C is a graph of the relative SPL frequency response of the compression driver configuration of FIG. 10A.

The final embodiment shown in FIG. 10A is a compression driver 10 with an annular ring slot exit 70 from the compression chambers 56 to suppress the first radial mode. In this embodiment, one compression chamber 56 may be created by the hub portion 36 extending generally parallel to and over the internal flat portion 34 and at least a portion of the V-shaped section 30 of the diaphragm 28. Another compression chamber 56 may be created by the second side 54 of the waveguide 48 having an initial segment 60 which is generally parallel to the external flat portion 32 of the diaphragm 28, an intermediate segment 64 that generally follows the contour of at least a portion of the V-shaped section 30 of the diaphragm 28, and a final segment 62 that tapers toward the driver exit 50. FIG. 10B illustrates an air model of this configuration, and FIG. 10C is a graph of the relative SPL frequency response of the compression driver 10 of FIG. 10A. As shown in FIG. 10C, the SPL response is comparatively flat from 2 kHz to 8 kHz with a 2 dB bump at 7 kHz, a roll-off to 14 kHz, a sharp spike at 17 kHz, and an abrupt drop above 17 kHz. The first radial mode in the compression chamber 56 is blocked by the annular slot exit 70 positioned at the radius of the mode's null. The frequency of the first mode is 13.84 kHz, and the higher-order modes are above the audio frequency range (26.79 kHz, 39.89 kHz, etc.).

The acoustical analysis of traditional and side-firing annular compression chambers is described below. The acoustical field in an annular compression chamber modeled by a flat annular ring is characterized by radial resonance modes (A. Voishvillo, "Compression Drivers' Phasing Plugs—Theory and Practice", presented at the 141$^{th}$ AES Convention, 2016, Los Angeles, preprint 9618). In general, an acoustical field in the chamber results from the solution of the zero-order Bessel equation with Neumann boundary conditions (zero velocity at the internal and external radii).

$$\left(\frac{\partial^2}{\partial r^2}+\frac{1}{r}\frac{\partial}{\partial r}\right)F(r)=-k^2F(r),\ R_1<r<R_2, \quad (1)$$

-continued $$\frac{\partial F(r)}{\partial r} = 0,\ r = R_1,\ r = R_2 \tag{2}$$

where $R_1$ and $R_2$ are the internal and external radii of the compression chamber $$k = \frac{\omega}{c} \text{ – wave number,}$$

c is the speed of sound.

Since the equation (1) is the zero-order Bessel equation, its solutions exist in the following forms:

At $k_0=0$ the solution exists in the form $P_0(r)=\text{const}$

At $k_i\neq 0$ the solution exists in the form:

$$P(k_ir)=AJ_0(k_ir)+BY_0(k_ir), i=1,2,3 \tag{3}$$

where A and B are constants not depending on radius r, but depending on wave numbers $k_i$, $J_0(k_ir)$ is a Bessel function of the first kind, zeroth order, and $Y_0(k_ir)$ is a Bessel function of the second kind, zeroth order.

Equation (4) for the search of the radial modes' wave numbers $k_i$ values and the corresponding frequencies of the modes in the chamber $f_i=k_ic/2\pi$ are derived from the equation (1) and the boundary conditions (5).

$$Y_1(k_iR_1)J_1(k_iR_2)+Y_1(k_iR_2)J_1(k_iR_1)=0 \tag{4}$$

$$AJ_1(kr)=-BY_1(kr) \text{ at } r=R_1 \text{ and } r=R_2 \tag{5}$$

$i=1, 2, 3 \ldots \infty$

The equation (4) is solved numerically. The roots of (4) are the wave numbers $k_i$ corresponding to the i-order radial resonances in the annular compression chamber.

Distributions of the sound pressure across the chamber at the found frequencies of radial modes are obtained from a numerical solution of equation (6):

$$F_i(k_i)=C_i(Y_1(k_iR_2)J_0(k_ir)-J_1(k_iR_2)Y_0(k_ir)) \tag{6}$$

where $C_i$ are constants not depending on r.

For the particular chamber shown in FIG. 10B the frequencies of the first three modes are:

$f_1=13.8$ kHz $f_2=26.8$ kHz $f_3=39.89$ kHz

Frequency of the first mode is within the audio range whereas the frequencies of the second and third mode are above frequency range and do not present interest. By equating (6) to zero, and by solving the equation (6) numerically, radius $R_0$ corresponding to the zero value of the first mode is found. If the assumption of the diaphragm's pistonic movement is valid, then by positioning the exit slot at the radius $R_0$, the first radial mode is blocked (but is still excited in the compression chamber!). Therefore, the first mode does not produce a severe notch on the SPL frequency response at the frequency 13.8 kHz—FIG. 10C.

Acoustical behavior of the system consisting of the side-firing annular compression chamber and part of the diaphragm radiating directly into the acoustical load differs from that of traditional annular compression chamber and an annular narrow slot exit. The direct-radiating part of the diaphragm is loaded by the acoustical path to the driver's exit (short "waveguide") and by the output impedance of the side-firing compression chamber. The chamber is loaded by the acoustical path that connects chamber's exit to the exit of the driver. Since the acoustical output impedance of the chamber is significantly higher than the impedance of acoustical path to the exit of the driver, the influence of the chamber's output impedance on radiation of the open part of the diaphragm may be ignored.

The frequencies of the resonance modes in the chamber are found through solution of Helmholtz equation in cylindrical coordinates with the corresponding boundary conditions (sound pressure gradient equals to zero at $r=R_1$ and $r=R_2$)—see (1) and (2). In case of the side-firing chamber, the situation is different. The boundary condition on the external radius $R_2$ corresponds to the condition $$\frac{\partial P(r)}{\partial r} = 0,\ r = R_2,$$

whereas the boundary condition at the exit $R_1$ is found from the following expression (7):

$$\frac{\partial P}{\partial r} = -j\omega\rho\frac{P}{Z_t(j\omega)} \tag{7}$$

A side-firing compression chamber with an exit along its internal radius $R_1$ does not have radial resonances at high frequencies if its acoustical loading can be approximated by a non-reactive acoustical impedance $\rho c/S_t$ (where $\rho$ is air density and c is the speed of sound, and $S_t$ is the area of the chamber's exit). A regular annular compression chamber has hard walls at external and internal radii that cause reflections of radially propagating sound waves and generate corresponding standing waves (resonances) that may adversely affect high-frequency SPL response. In a side-firing compression chamber, reflection from the exit may not occur, but acoustical signals excited at the different radial distances of the chamber come to the exit with different time delays and phases. If the radial dimension of the chamber is comparable with the wavelength of the radiated acoustical signal, a "combing effect" or "interference" may occur, and it would generate notches on the SPL frequency response. However, with an optimal radial dimension of the side-firing compression chamber, the adverse "interference" can be avoided.

The aforementioned effect presumes pistonic movement of the diaphragm. In reality, at high frequencies, the diaphragm may not vibrate as a piston, and its movement would be characterized by partial vibrations, i.e. mechanical resonances. A negative effect produced by the diaphragm's mechanical resonances is potential irregularity of the SPL response at high frequencies. Another negative aspect of the mechanical resonances is their interaction with acoustical resonances in the compression chamber that may cause inaccuracy of the driver performance's prediction based on the acoustical model and the assumption of the diaphragm's pistonic movement throughout the audio frequency range. A positive effect of the mechanical resonances is that the elevated level of the overall displacement, velocity, and acceleration at resonances produce higher SPL output. Such a diaphragm property is actually intentional and is a result of the mechanical structural FEA numerical optimization intended to increase the energy of the diaphragm vibration at the high frequency range.

In the above embodiments and analysis, in one example, dimensions of the compression chamber dimensions may be as follows: internal radius $R_1$ is 6.2 mm, external radius $R_2$ 18 mm, radius of the V-shaped apex is 12.5 mm, depth of the diaphragm (distance from the apex to the flat part is 1.9 mm, internal flat part radii are 6.2 mm and 8.8 mm, external flat part radii are 15.6 mm and 18 mm, radius of the driver's acoustical exit is 7.6 mm. In addition, for the above analysis, the driver is loaded by a reference axisymmetric horn having 140 mm mouth radius and 190 mm length, and the acoustical FEA simulations correspond to 1 meter from the mouth of the horn.

The new topology is scalable for different diameters of the voice coil, and it provides significant simplification of the configuration of the compression driver and correspondingly lower production cost without sacrificing the driver's performance. The SPL frequency response is characterized by smoothness and easy equalizability, which implies the use of minimal components in a crossover network to match the driver's response with the response of its corresponding woofer. The compression driver can be used in cost-effective studio monitors, CBT arrays, karaoke systems, various other types of arrays, and in automotive audio systems.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A compression driver, comprising:
- a magnet assembly;
- a waveguide mounted directly to the magnet assembly, the waveguide having a first side and an opposed second side, the waveguide having a central aperture forming an exit of the compression driver;
- an annular diaphragm disposed above the magnet assembly and adjacent the second side of the waveguide, the diaphragm having an external flat portion generally coplanar with an internal flat portion; and
- a compression chamber defined in a space between the diaphragm and the second side of the waveguide, the second side of the waveguide having a final segment that tapers toward the central aperture, wherein only part of the diaphragm is loaded by the compression chamber and part of the diaphragm radiates directly to the exit of the compression driver.

2. The compression driver of claim 1, wherein the second side of the waveguide has an initial segment which is generally parallel to the external flat portion of the diaphragm.

3. The compression driver of claim 1, wherein the diaphragm has a V-shaped section between the external flat portion and the internal flat portion.

4. The compression driver of claim 3, wherein the second side of the waveguide has an intermediate segment that generally follows the contour of at least a portion of the V-shaped section of the diaphragm.

5. The compression driver of claim 1, wherein the magnet assembly includes a back plate having a centrally disposed pole piece, and further comprising a hub portion mounted to the pole piece.

6. The compression driver of claim 5, wherein the hub portion extends generally parallel to and over at least a portion of the internal flat portion of the diaphragm.

7. The compression driver of claim 4, wherein the magnet assembly includes an annular permanent magnet disposed between an annular top plate and the back plate, the magnet assembly providing a magnetic field in a magnetic gap located between the pole piece and an inside surface of the top plate, and further comprising a voice coil disposed in the magnetic gap and coupled to the diaphragm for producing movement of the diaphragm.

8. A compression driver, comprising:
- a magnet assembly including a back plate having a centrally disposed pole piece;
- a hub portion mounted to the pole piece;
- a waveguide mounted directly to the magnet assembly, the waveguide having a first side and an opposed second side, the waveguide having a central aperture generally aligned with the hub portion and forming an exit of the compression driver;
- an annular diaphragm disposed above the magnet assembly and adjacent the second side of the waveguide, the diaphragm having a V-shaped section between an external flat portion and an internal flat portion; and
- a compression chamber defined in a space between the diaphragm and the second side of the waveguide, the second side of the waveguide having an initial segment which is generally parallel to the external flat portion of the diaphragm and a final segment that tapers toward the central aperture, such that only part of the diaphragm is loaded by the compression chamber and part of the diaphragm radiates directly to the exit of the compression driver.

9. The compression driver of claim 8, wherein the second side of the waveguide has an intermediate segment that generally follows the contour of at least a portion of the V-shaped section of the diaphragm.

10. The compression driver of claim 9, wherein the intermediate segment extends to a tip of the V-shaped section of the diaphragm.

11. The compression driver of claim 9, wherein the intermediate segment extends to an inner edge of the internal flat portion of the diaphragm.

12. The compression driver of claim 8, wherein the hub portion extends generally parallel to and over at least a portion of the internal flat portion of the diaphragm.

13. The compression driver of claim 8, wherein the magnet assembly includes an annular permanent magnet disposed between an annular top plate and the back plate, the magnet assembly providing a magnetic field in a magnetic gap located between the pole piece and an inside surface of the top plate, and further comprising a voice coil disposed in the magnetic gap and coupled to the diaphragm for producing movement of the diaphragm.

14. The compression driver of claim 8, wherein an outer surface of the hub portion tapers from a first end proximate the pole piece to a second end disposed at a distance from the pole piece.

15. A compression driver, comprising:
- a magnet assembly including a back plate having a centrally disposed pole piece;
- a hub portion mounted to the pole piece;
- a waveguide mounted directly to the magnet assembly, the waveguide having a first side and an opposed second side, the waveguide having a central aperture generally aligned with the hub portion and forming an exit of the compression driver;
- an annular diaphragm disposed above the magnet assembly and adjacent the second side of the waveguide, the diaphragm having a V-shaped section between an external flat portion and an internal flat portion, the hub portion extending generally parallel to and over at least a portion of the internal flat portion of the diaphragm; and a compression chamber defined in a space between the diaphragm and the hub portion and between the diaphragm and the second side of the waveguide, the second side of the waveguide having a final segment that tapers toward the central aperture, such that only part of the diaphragm is loaded by the compression chamber and part of the diaphragm radiates directly to the exit of the compression driver.

16. The compression driver of claim 15, wherein the second side of the waveguide has an initial segment which is generally parallel to the external flat portion of the diaphragm.

17. The compression driver of claim 16, wherein the second side of the waveguide has an intermediate segment that generally follows the contour of at least a portion of the V-shaped section of the diaphragm.

18. The compression driver of claim 15, wherein the hub portion extends over at least a portion of the V-shaped section of the diaphragm.

19. The compression driver of claim 15, wherein the magnet assembly includes an annular permanent magnet disposed between an annular top plate and the back plate, the magnet assembly providing a magnetic field in a magnetic gap located between the pole piece and an inside surface of the top plate, and further comprising a voice coil disposed in the magnetic gap and coupled to the diaphragm for producing movement of the diaphragm.

20. The compression driver of claim 15, wherein an outer surface of the hub portion tapers from a first end proximate the pole piece to a second end disposed at a distance from the pole piece.

* * * * *